United States Patent
Hoshi et al.

(10) Patent No.: US 8,211,228 B2
(45) Date of Patent: Jul. 3, 2012

(54) METHOD FOR PRODUCING SINGLE CRYSTAL AND A METHOD FOR PRODUCING ANNEALED WAFER

(75) Inventors: Ryoji Hoshi, Fukushima (JP); Takahiro Yanagimachi, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 1415 days.

(21) Appl. No.: 11/792,693

(22) PCT Filed: Oct. 21, 2005

(86) PCT No.: PCT/JP2005/019385
§ 371 (c)(1),
(2), (4) Date: Jun. 8, 2007

(87) PCT Pub. No.: WO2006/064610
PCT Pub. Date: Jun. 22, 2006

(65) Prior Publication Data
US 2008/0184928 A1  Aug. 7, 2008

(30) Foreign Application Priority Data
Dec. 16, 2004 (JP) .................. 2004-363916

(51) Int. Cl.
*C30B 15/14* (2006.01)
(52) U.S. Cl. ............. 117/11; 117/12; 117/13; 117/33; 117/82; 117/83
(58) Field of Classification Search ........... 117/11–13, 117/33, 82–83
See application file for complete search history.

(56) References Cited

U.S. PATENT DOCUMENTS

| | | | |
|---|---|---|---|
| 6,191,009 B1* | 2/2001 | Tamatsuka et al. | 438/471 |
| 6,893,499 B2* | 5/2005 | Fusegawa et al. | 117/13 |
| 7,594,966 B2* | 9/2009 | Hoshi et al. | 117/89 |
| 2001/0029883 A1* | 10/2001 | Minami et al. | 117/20 |
| 2002/0081440 A1* | 6/2002 | Murakami et al. | 428/446 |
| 2003/0051658 A1* | 3/2003 | Nakagawa et al. | 117/13 |
| 2003/0106484 A1* | 6/2003 | Fusegawa et al. | 117/19 |
| 2003/0157814 A1* | 8/2003 | Iida et al. | 438/795 |
| 2006/0016387 A1* | 1/2006 | Yokoyama et al. | 117/84 |
| 2006/0075957 A1* | 4/2006 | Takeno et al. | 117/84 |

(Continued)

FOREIGN PATENT DOCUMENTS
CN   1463469 A   12/2003
(Continued)

OTHER PUBLICATIONS

Feb. 2, 2010 extended European Search Report issued in EP 05795662.5.

(Continued)

*Primary Examiner* — Bob M Kunemund
(74) *Attorney, Agent, or Firm* — Oliff & Berridge, PLC

(57) ABSTRACT

The present invention is a method for producing a single crystal that is a multi-pulling method for pulling a plurality of single crystals from a raw material melt in a same crucible in a chamber by a Czochralski method, comprising steps of: pulling a single crystal from a raw material melt; then additionally charging polycrystalline raw material in a residual raw material melt without turning off power of a heater, and melting the polycrystalline raw material; then pulling a next single crystal; and repeating the steps and thereby pulling the plurality of single crystals.

18 Claims, 6 Drawing Sheets

U.S. PATENT DOCUMENTS

| | | | |
|---|---|---|---|
| 2006/0266278 A1* | 11/2006 | Ono et al. | 117/19 |
| 2006/0272570 A1* | 12/2006 | Hoshi et al. | 117/20 |
| 2006/0292890 A1* | 12/2006 | Ammon et al. | 438/770 |
| 2007/0186845 A1* | 8/2007 | Umeno | 117/13 |
| 2008/0184928 A1* | 8/2008 | Hoshi et al. | 117/13 |
| 2009/0081856 A1* | 3/2009 | Umeno | 438/501 |
| 2009/0249995 A1* | 10/2009 | Takano et al. | 117/15 |

FOREIGN PATENT DOCUMENTS

| | | |
|---|---|---|
| EP | 0 942 078 A1 | 9/1999 |
| EP | 1 551 058 AI | 7/2005 |
| EP | 1 557 883 A1 | 7/2005 |
| JP | A 08-330316 | 12/1996 |
| JP | A 11-079889 | 3/1999 |
| JP | A 11-147786 | 6/1999 |
| JP | A 2000-178099 | 6/2000 |
| JP | A 2001-342097 | 12/2001 |
| JP | A 2002-184779 | 6/2002 |
| JP | A 2002-353225 | 12/2002 |
| JP | A 2003-040694 | 2/2003 |
| JP | A 2003-327494 | 11/2003 |
| JP | A 2004-134439 | 4/2004 |
| WO | WO 02/14587 A1 | 2/2002 |
| WO | 2004-044278 * | 5/2004 |
| WO | WO 2004/040650 A1 | 5/2004 |
| WO | WO 2004/044278 A1 | 5/2004 |

OTHER PUBLICATIONS

Office Action issued in Japanese Patent Application No. 2004-363916, dated Aug. 24, 2010 (with partial translation).

Feb. 17, 2012 European Office Action issued in European Application No. 05 795 662.5.

Mar. 5, 2012 Chinese Office Action issued in Chinese Application No. 200580043234.3 with partial English-language translation.

* cited by examiner (a) PATTERN 1 : 35 hr or less (b) PATTERN 2 : 35 − 70 hr (c) PATTERN 3 : 75 hr or more PATTERN 2 : 35-70 hr PATTERN 1 : 3 5 − 7 0 hr

METHOD FOR PRODUCING SINGLE CRYSTAL AND A METHOD FOR PRODUCING ANNEALED WAFER

TECHNICAL FIELD

The present invention relates to a method for producing a single crystal such as silicon for slicing a silicon wafer and such used as a substrate of semiconductor device such as memory and CPU.

BACKGROUND ART

Recently, in semiconductor integrated circuits, their integration degree becomes significantly improved, and for obtaining an integrated circuit having high performance, high reliability, and high yield, it has been required that both mechanical precision and electrical characteristic are more excellent. Along with this, with respect to quality of a silicon wafer used for producing a device of semiconductor integrated circuit and so forth, stricter conditions have been imposed and it has been required to produce a silicon wafer of more excellent crystal quality. Moreover, by worldwide extension and demand enlargement of semiconductor integrated circuit, silicon wafers of high quality have lead to being required in large quantity and stably, in varied ways.

For a method for obtaining a silicon wafer from polycrystalline material of semiconductor such as silicon, there is Czochralski method (hereinafter, abbreviated as CZ method) in which a polycrystalline material is once melted in a crucible and a seed crystal is pulled from a raw material melt and thereby a silicon single crystal is obtained. The silicon single crystal grown by the CZ method is sliced and subjected to lapping, chamfering, polishing, and so forth and thereby, a silicon wafer is produced. Such a method for improving quality of a silicon wafer includes a method for reducing density and size of Grown-in defects caused by single crystal growth that degrade an oxide dielectric breakdown voltage characteristic or a device characteristic. First, formation of the Grown-in defects will be explained.

In the point defects causing Grown-in defects due to single crystal growth, there are Vacancy that is a point defect of atomic vacancy type and Interstitial that is a point defect of interstitial silicon type. The saturation concentration of the point defects is a function of temperature, and becomes in a state of supersaturation along with lowering of temperature in the single crystal growth. In the state of the supersaturation, pair annihilation, outward diffusion or gradient diffusion, and so forth are caused and thereby, the state proceeds to relax the supersaturation state. As a result, one of Vacancy or Interstitial comes to remain as point defects of dominant supersaturation. It is known that if a ratio V/G of a pulling rate V in growing a straight body of the single crystal and a crystal temperature gradient G along a pulling axis direction near the solid-liquid interface is large, the state is prone to be in an excessive state of Vacancy, and on the other hand, if V/G is small, the state is prone to be in an excessive state of Interstitial. If the excessive concentration becomes a certain degree or more, these point defects become agglomerated and form Grown-in defects that are secondary defects of the point defects in the growth of the single crystal. It is known that in the case that Vacancy is dominant, the Grown-in defects that are the secondary defects include void defects observed as COPs or FPDs or the like and defects observed as OSFs after oxidation treatment and degrade oxide film characteristics. On the other hand, in the case that Interstitial is dominant, Grown-in defects that are the secondary defects observed as dislocation loops or the like become formed and come to cause serious failure such as leakage.

A technology for controlling the Grown-in defects not to be generated includes a technology for producing defect-free crystal that has been disclosed in Japanese Patent Application Laid-open (Kokai) No. 8-330316, Japanese Patent Application Laid-open (Kokai) No. 11-79889, and so forth. In order to reduce the excessive concentration of point defects as much as possible, a ratio V/G of a pulling rate V in growing a straight body of the single crystal and a crystal temperature gradient G along a pulling axis direction near the solid-liquid interface is controlled to be in a very limited range. Therefore, the range of the pulling rate V is limited to be in a very narrow range and therefore, actually, defectives are frequently generated and yield and productivity are greatly degraded. Accordingly, in Japanese Patent Application Laid-open (Kokai) No. 11-147786, there has been provided a technology for improving the control width in CZ method to be large, producing a silicon single crystal under a growth condition that is easy to be controlled, and therewith reducing the crystal defects.

However, according to such technologies, in the case of continuously producing many silicon single crystals by a small number of apparatuses for producing a single crystal, variation is caused in quality of the silicon single crystal to be grown in the same condition and therefore, it is difficult to satisfy, as a low cost, the current demand of wafer products that silicon wafers of high quality are required in a large quantity and stably. The cause that such variation of qualities of silicon single crystals is generated is as follows.

The crystal temperature gradient G along a pulling axis direction near the solid-liquid interface of a single crystal is determined a thermal environment composed of heater, heat shield, and so forth (HZ: Hot zone) introduced in the apparatus for producing a single crystal. However, along with time elapse, the silicon oxide formed by reacting the silicon that is raw material and oxygen generated from the quartz crucible come to adhere to a low-temperature part such as a chamber of the apparatus for producing a single crystal. The chamber part is a part of absorbing a radiant heat and, if the part is covered with an oxide, thermal absorbing ability is prone to be reduced and G becomes small. Therefore, if G lowering is caused along with time elapse, V/G increases and consequently the sizes of Grown-in defects increase, and the variation are caused in quality of the silicon single crystal to be pulled.

Accordingly, in Japanese Patent Application Laid-open (Kokai) No. 2003-327494, there has been provided a technology in which an average value of the heater power consumed in production of necking portion of the single crystal is calculated, and based on the value, the pulling rate V in pulling the straight body of the single crystal is modified and thereby, individual difference between apparatus or time-oriented mobilizing factor caused by degradation of the heater and such in the respective batches of the silicon single crystals to be produced is dealt with. However, because G gradually becomes small during the single crystal growth, in the case of producing silicon single crystals of desired quality in a large quantity and stably, it is not sufficient only to modify the pulling rate V in the straight body in a single uniform way by a fixed amount under the average value of the heater power consumed in the production of the necking portion of the single crystal.

Moreover, obtaining defect-free wafers of high quality by the control only in the step of single crystal growth is difficult and at a very high cost as described above and therefore, occasionally, the growth of the single crystal is performed under a low-cost condition in which the growth of the single crystal is easy to be controlled, and the wafers sliced from the silicon single crystal are subjected to high-temperature heat treatment and so forth and, defects near the wafer surface are controlled to be annihilated or to have a desired defect density. The wafer to which such a characteristic is most applied is a wafer having a surface defect-free layer (Denuded Zone, DZ) and its superiority has been almost proved.

The wafers in which a silicon wafer sliced from a silicon single crystal is treated and thereby its surface vicinity is made to be defect-free include (a) annealed wafer in which a silicon wafer is heat-treated at a high temperature and thereby a defect-free layer is formed in the surface layer (Japanese Patent Application Laid-open (Kokai) No. 2002-184779), and (b) epitaxial wafer in which a silicon wafer is used as a substrate and thereon a defect-free layer is epitaxially grown. In general, a silicon wafer used for them, Grown-in defects formed in the crystal growth exist. Among them, the epitaxial wafer is at a high cost and therefore, annealed wafer is dominant in the aspect of production cost. However, it is very important for characteristics of a wafer for annealing that sizes of Grown-in defects are small and Grown-in defects are in a state of being easy to be annihilated so that defects near the surface layer are easily annihilated or easily controlled to have a desired defect density by heat treatment. Therefore, it is necessary that V/G is set to be small to some extent in a stage of the single crystal growth and that the variation of V/G is controlled to be small.

That is, as described above, it has been indicated that the type of point defects finally becoming dominant is changed by V/G and that the type is Vacancy when V/G is large and the type is Interstitial when small. However, in the region of Vacancy, as the value of V/G is smaller, the concentration of Vacancies that are finally introduced becomes smaller. When the concentration of the introduced Vacancies is small, the sizes of Grown-in defects formed by agglomerating them become small. However, the direction that V/G becomes smaller is also the direction that the pulling rate V in pulling the straight body of the single crystal becomes small and therefore, generally is the direction that the cost becomes high. Accordingly, using the maximum V/G for being capable of annihilating defects by the heat treatment performed after producing the wafer becomes the key for suppressing the cost. This value depends on the condition of the heat treatment.

Moreover, it is known that also by doping nitrogen in the growth of the single crystal, the sizes of Grown-in defects can be small, and in the wafer for annealing, occasionally, nitrogen is doped in the single crystal growth. Furthermore, in performing annealing, Bulk Micro Defects (hereinafter, abbreviated as BMD) are formed inside the wafer at the same time of annihilating the surface defects or of controlling the surface defects to have desired density and thereby, the wafer can be provided with a capability of capturing heavy metal contaminants in the device process (gettering capability).

It is known that also in forming the BMDs, the BMDs are more easily formed in the nitrogen doping. Therefore, nitrogen doping in the crystal grown for slicing the wafer for annealing therefrom has two merits that Grown-in defects are made to be small and that BMDs are made to be easy to be formed (Japanese Patent Application Laid-open (Kokai) No. 2002-353225). However, in the growth of the silicon single crystal for the annealed wafer doped with nitrogen, the nitrogen concentration is determined by its segregation and therefore, the nitrogen concentration in the crystal axis direction is different. Furthermore, because the influence on the formation of Grown-in defects is different according to the difference of G even in the same nitrogen concentration, it is very difficult to obtain the wafers of uniform quality doped with nitrogen in a large quantity and stably.

A method in which the concentration of the doped nitrogen or the fluctuation of resistance by the segregation of a dopant such as phosphorus or boron for controlling the resistance is suppressed to be in a constant range and thereby the single crystal ingots of the same quality are obtained in a large quantity by CZ method includes multi-pulling method. Here, a multi-pulling method is a method of, pulling a single crystal, then additionally charging polycrystalline raw material in the residual silicon melt without turning off power of the heater, pulling a next single crystal, and repeating the steps and thereby pulling a plurality of single crystals (International Publication No. WO 02/014587). Thereby, many crystal ingots of the same quality can be pulled in the quite same condition in one batch and uniform crystals can be obtained in a large quantity and therefore, it is thought that the multi-pulling method has a utility value for overcoming the above-described difficulty.

DISCLOSURE OF THE INVENTION

Accordingly, the present invention has been made to solve the above problems. An object of the present invention is to provide a method for producing a single crystal for producing wafer products of desired quality at a low cost in a large quantity and stably, and a method for producing an annealed wafer using it.

To achieve the above object, the present invention provides a method for producing a single crystal that is a multi-pulling method for pulling a plurality of single crystals from a raw material melt in a same crucible in a chamber by a Czochralski method, comprising steps of:

pulling a single crystal from a raw material melt; then additionally charging polycrystalline raw material in a residual raw material melt without turning off power of a heater, and melting the polycrystalline raw material; then pulling a next single crystal; and repeating the steps and thereby pulling the plurality of single crystals;

wherein in a case of setting a ratio of a pulling rate V and crystal temperature gradient G near a solid-liquid interface along a pulling axis direction when a straight body of the single crystal is grown to be V/G, in order to control the V/G of each of the single crystals to be pulled to a predetermined value, any one or more of pulling conditions of at least, the pulling rate V, flow amount of an inert gas introduced into the chamber, pressure in the chamber, and distance between a melt surface of the raw material melt and a heat-shielding member disposed oppositely to the raw material melt surface in the chamber, is preliminarily modified according to an elapsed time from beginning of operation, before initiating pulling the single crystal; and thereby the single crystal having a desired defect region is grown.

As described above, by using the low-cost multi-pulling method by which many single crystals can be obtained in a short time, the pulling condition(s) such as the pulling rate V is preliminarily modified before initiating pulling the single crystal in order to control V/G of the single crystal to be a predetermined value according to an elapsed time from beginning of operation and thereby, single crystals of desired quality can be produced at a low cost in a large quantity and stably. As the elapsed time from beginning of operation, the elapsed time from turning on the power of the heater can be the baseline, and the pulling condition(s) such as the pulling rate V is modified according to the elapsed time in order to control the respective V/G of the single crystals to be pulled to be a predetermined value and thereby, lowering of the crystal temperature gradient G along with the elapse of the operation time in a same batch and so forth can be flexibly dealt with and single crystals of desired quality can be grown.

In the above case, it is preferable that in a case of pulling at least two or more single crystals having a same variety out of the plurality of single crystals to be pulled, in order that the V/G is a same predetermined value, the pulling condition(s) of each of the single crystals is/are preliminarily modified according to what time of pulling the single crystal is, before initiating pulling the single crystal.

In such a method in which the pulling condition(s) is/are preliminarily modified before initiating pulling the single crystal according to what time of pulling the single crystal is so that the V/G is a predetermined value, the setting method of the pulling condition(s) is simple and can be performed at a low cost.

Moreover, it is preferable that the modification of the pulling condition(s) is performed by preliminarily preparing a plurality of patterns of the respective pulling conditions under the elapsed time and selecting the most appropriate pattern of the pulling condition for the single crystal to be pulled according to the elapsed time.

Such a method in which the modification of the pulling condition(s) is performed by preliminarily preparing a plurality of patterns of the respective pulling conditions under the elapsed time and selecting the most appropriate pattern of the pulling condition according to the elapsed time is simple and certain, and can be performed at a low cost.

Furthermore, it is possible that a silicon single crystal that is the single crystal doped with nitrogen is pulled.

The present invention can particularly effectively suppress the variation of V/G according to time elapse that is caused by doping the single crystal with nitrogen and therefore, by doping the single crystal with nitrogen, there can be produced a uniform nitrogen-doped annealed wafer of high quality in which the Grown-in defects are small and BMDs are easy to be formed.

Moreover, the present invention provides a method for producing an annealed wafer, comprising steps of:

slicing a silicon wafer from a silicon single crystal produced by such a method for producing a single crystal;

subjecting the silicon wafer to a heat treatment at 1100° C.~1400° C. for 5 min~600 min under a non-oxidizing atmosphere of hydrogen, argon, or a mixed gas thereof; and thereby producing the annealed wafer.

By slicing and heat-treating a silicon wafer as described above, the Grown-in defects in the wafer surface can be annihilated and BMDs can be formed. When the temperature of the heat treatment is set to 1100° C. or more and the heat treatment time is set to 5 min or more, the annihilation effect of the Grown-in defects near the wafer surface can be held to be high. And when the temperature of the heat treatment is set to 1400° C. or less and the heat treatment time is set to 600 min or less, there can be reduced the problems of metal contamination into the wafer products by the heat treatment and of durability of the heat treatment furnace, and the cost caused by the treatment time lengthening, and so forth. For the temperature of the heat treatment and the heat treatment time, the most appropriate conditions can be selected by considering the annihilation effect of the Grown-in defects required according to the state of the wafer to be heat-treated and the required cost for the heat treatment. As described above, the present invention is particularly effective in the case that qualities of the silicon single crystals for nitrogen-doped annealed wafers are made to be uniform, in which simple unified modification of the pulling condition(s) is not sufficient because a plurality of factors are involved therein.

Furthermore, it is possible that an average density of surface-near defects having sizes of 20 nm or more in a surface vicinity from each of surfaces of the annealed wafers to a depth of 5 μm is 20/cm$^2$ or less, and variation σ of densities of surface-near defects having sizes of 20 nm or more in a surface vicinity from each of surfaces of the annealed wafers to a depth of 5 μm along its crystal axis direction is 100% or less of an average of the densities.

As described above, according to the present invention, the variation of surface-near defects in the wafer products obtained by heat treating the wafers sliced from the pulled silicon single crystals can be accurately controlled to be in the certain standard. In addition, according to the present invention, as well as the variation of the densities of the surface-near defects of the annealed wafers along the crystal axis direction that are obtained from one single crystal, the variation of the densities of the surface-near defects of the annealed wafers including the wafer products to be obtained from other single crystals obtained by the same multi-pulling method can be accurately controlled to be in the certain standard.

As described above, by the present invention, yield and productivity of the wafer products can be improved, increase of demand of wafer products of constant quality becomes possible to be satisfied at a low cost.

BEST MODE FOR CARRYING OUT THE INVENTION

Figure 1:
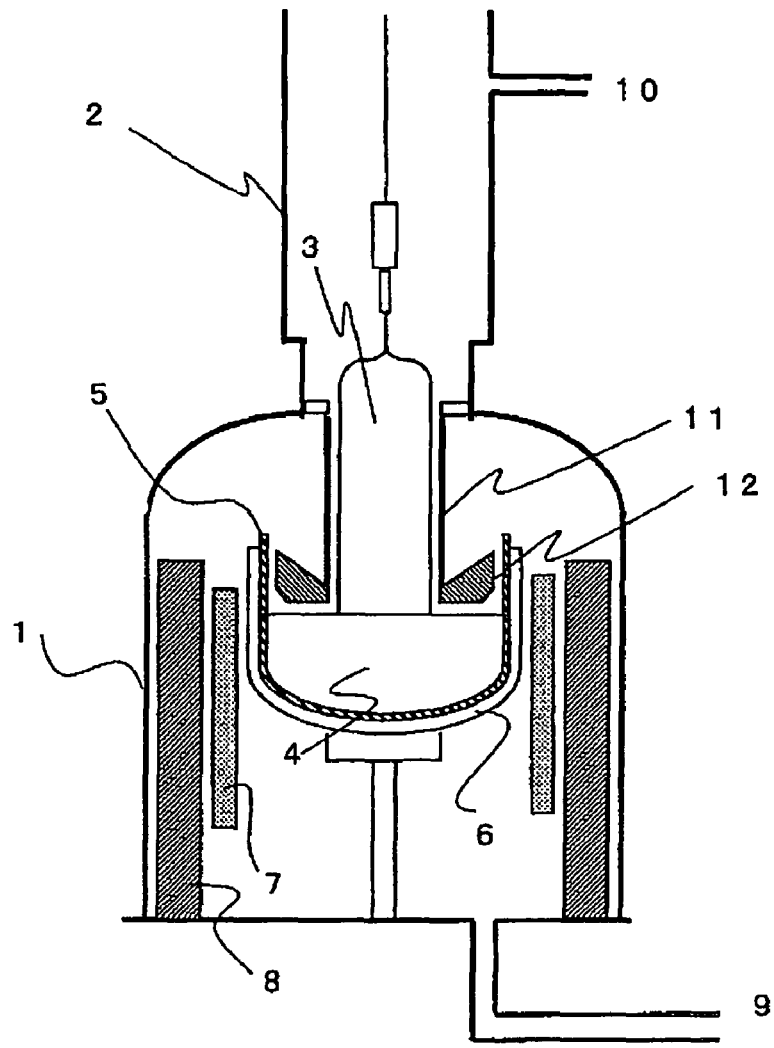
FIG. 1 is a schematic view of an apparatus for producing a single crystal used in the present invention.

For obtaining a large number of single crystal ingots of the same quality, the present inventors have pulled a plurality of crystals of the same variety by controlling V/G under the same pulling condition in the same batch by a multi-pulling method. However, it has been found that the qualities of the obtained respective crystal ingots do not necessarily satisfy uniformity required in recent years. That is, for example, by a multi-pulling method, when one single crystal ingot is pulled and then the raw material is added in the crucible and thereby the melt amount is returned to quite the same and a next single crystal ingot is pulled, it is common knowledge that as long as crystals of the same variety are pulled, the single crystals are pulled by controlling V/G under quite the same condition.

However, when wafers were produced by slicing the silicon single crystal pulled as described above and subjected to the heat treatment, for example, in an argon atmosphere at 1200° C. for 1 hour, and an average density of defects having sizes of 20 nm or more near the surface (from the surface to depth approximately 5 μm) over the wafer entire plane was measured by an apparatus for measuring defect density near the surface (M0601, manufactured by MITUI KINZOKU Co., Ltd.), it has been found that the variation is large and wafers becoming out of the required standard occur. It has been found that this is because the assumption that the V/G becomes the same because of pulling the single crystals under quite the same pulling condition(s) is incorrect and actual V/G values are different among the plurality of single crystal ingots.

Accordingly, the present inventors have found that in a multi-pulling method, the pulling conditions are preliminarily modified according to an elapsed time from beginning of operation before initiating pulling the single crystal and thereby actual V/G values of the plurality of single crystal ingots can be set to a predetermined value. And, the present invention has been accomplished.

Hereinafter, embodiments of the present invention will be explained with reference to drawings.

In the present invention, a multi-pulling method by which a plurality of single crystals are pulled from a raw material melt in a same crucible in a chamber by a Czochralski method is used. And, first, by FIG. 1, a schema of an apparatus for producing a single crystal to be used will be explained.

In the apparatus for producing a single crystal, a quartz crucible 5 fit into a graphite crucible 6 is placed through a rotation shaft inside a main chamber 1 and rotated at a desired rotation velocity by a motor. A heater 7 is provided so as to surround the graphite crucible 6. By the heater 7, the raw material silicon polycrystal contained in the quartz crucible 5 is melted to be a raw material melt 4. Moreover, a heat insulating material 8 is provided and prevents radiant heat from the heater 7 from radiating directly to a metal instrument such as the main chamber 1 and so forth. Moreover, a heat-shielding member 12 is disposed oppositely to the melt surface by a predetermined interval above the melt surface of the raw material melt 4 and shields the radiant heat from the raw material melt surface. After a seed crystal is immersed in the crucible, a rod single crystal 3 is pulled from the raw material melt 4. The crucible can rise and fall in the direction of the crystal growth axis, and the crucible is made to rise during the growth so as to compensate for lowering amount of melt surface of the raw material melt 4 that is the decreasing amount by progress of the growth of the single crystal, and thereby the height of the melt surface of the raw material melt 4 can be held constantly to be constant.

Furthermore, the inert gas such as an argon gas is introduced as a purge gas from a gas inlet duct 10 during the growth of a single crystal, and passes between the single crystal 3 in pulling and a gas flow-guide cylinder 11 and then passes between the heat-shielding member 12 and the melt surface of the raw material melt 4, and is discharged from the gas outlet duct 9. The flow amount of the introduced gas and the amount of the discharged gas by a pump or a valve are controlled and thereby, the pressure inside the chamber in pulling is controlled. Moreover, the distance between the melt surface of the raw material melt 4 and the heat-shielding member 12 can be modified easily and high-precisely by, rising the crucible at a velocity different from the lowering amount of the melt surface along the crystal growth axis and thereby raising or lowering the height of the raw material melt surface along the crystal growth axis, or raising and lowering the gas flow-guide cylinder 11 by a driving means and thereby vertically moving the position of the heat-shielding member 12.

By the apparatus for producing a single crystal, the multi-pulling method for pulling a plurality of silicon single crystals from the raw material melt 4 in the same crucible is performed. Specifically, a single crystal is pulled from a raw material melt 4, and then polycrystalline raw material are additionally charged in a residual raw material melt 4 without turning off power of the heater 7 and melted, and raw material melt 4 is recovered to the original melt amount, and then a next single crystal is pulled, and the steps are repeated and thereby the plurality of silicon single crystals are pulled. Then, in order to control V/G of the respective pulling single crystals to be a predetermined value, a pulling condition is preliminarily modified according to an elapsed time from beginning of operation before initiating pulling the single crystal, and thereby the single crystal having a desired defect region is grown. Here, the base time of the beginning of operation can be set to, for example, a time of initiation of heating by the heater 7.

Here, in accordance with the lowering amount of the crystal temperature gradient G that becomes lowered according to the elapsed time from the beginning of operation, the pulling rate V when a straight body of the next single crystal is grown can be lowered to control V/G to be a predetermined value. In particular, when the crystal comes to have dislocations in the growth of the silicon single crystal, it is necessary that the power supplied to the heater 7 is increased and the crystal grown until then is immersed in the melt and remelted. And therefore, gap to planned time from the beginning of operation to the end of pulling a predetermined single crystal is occasionally caused. However, the gap can be addressed by modifying the pulling rate V and controlling V/G to be a predetermined value according to the elapsed time from the beginning of operation.

Moreover, G to be lowered according to the elapsed time from the beginning of operation is held to be a predetermined value by modifying pulling conditions except the pulling rate V, such as flow amount of an inert gas such as an argon gas, pressure in the chamber, and distance between a melt surface of the raw material melt 4 and a heat-shielding member 12 disposed oppositely to the raw material melt surface in the chamber, and therethrough, V/G is held to be a predetermined value and a single crystal having a desired defect region can be grown.

Furthermore, according to the elapsed time from the beginning of operation, two or more pulling conditions of the pulling rate V, the flow amount of the inert gas, the pressure in the chamber, and the distance between the melt surface of the raw material melt 4 and the heat insulating member 12, are combined and V/G is controlled to be a predetermined value according to the elapsed time and thereby, it also becomes possible to improve the precision of quality of the single crystal having a desired defect region.

In the case that at least two or more single crystals of the same variety in the plurality of single crystals to be pulled are pulled, the pulling condition(s) of the respective single crystals can be modified according to what time of pulling the single crystal is so that V/G becomes the same predetermined value. Thereby, the modification of the pulling condition is simplified and the cost is reduced. Also, by such a simple method, uniformity of the quality of the single crystals can be enhanced drastically, compared to the case of pulling the single crystals by setting the same conditions in a single uniform way as a conventional method.

When the modification of the pulling condition(s) is performed by preliminarily preparing a plurality of patterns of the respective pulling conditions under the elapsed time and selecting the most appropriate pattern of the pulling condition for the single crystal to be pulled according to the elapsed time, the method is simple and certain and at a low cost. For example, preliminarily, through an experiment and so forth, a plurality of patterns based on the elapsed time are input in a computer and such, and the most appropriate pattern of the pulling condition for the pulling single crystal to be pulled according to the elapsed time is selected by program execution and such and thereby, the control is performed so that V/G becomes a predetermined value.

Figure 8:
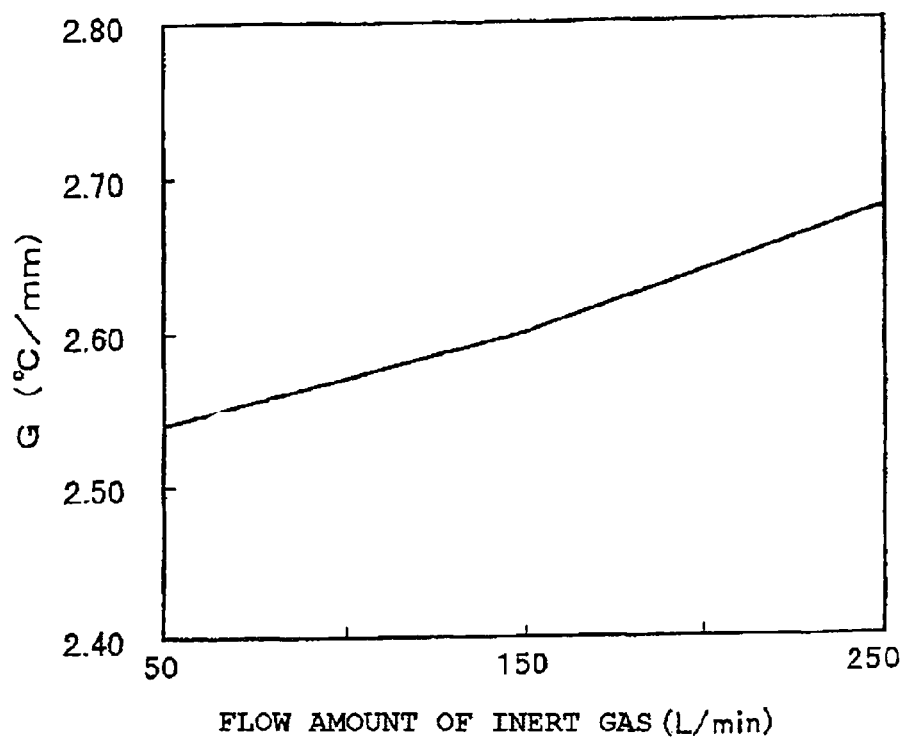
FIG. 8 is a graph showing an example of the relation between the flow amount of the inert gas and the crystal temperature gradient G.
Figure 9:
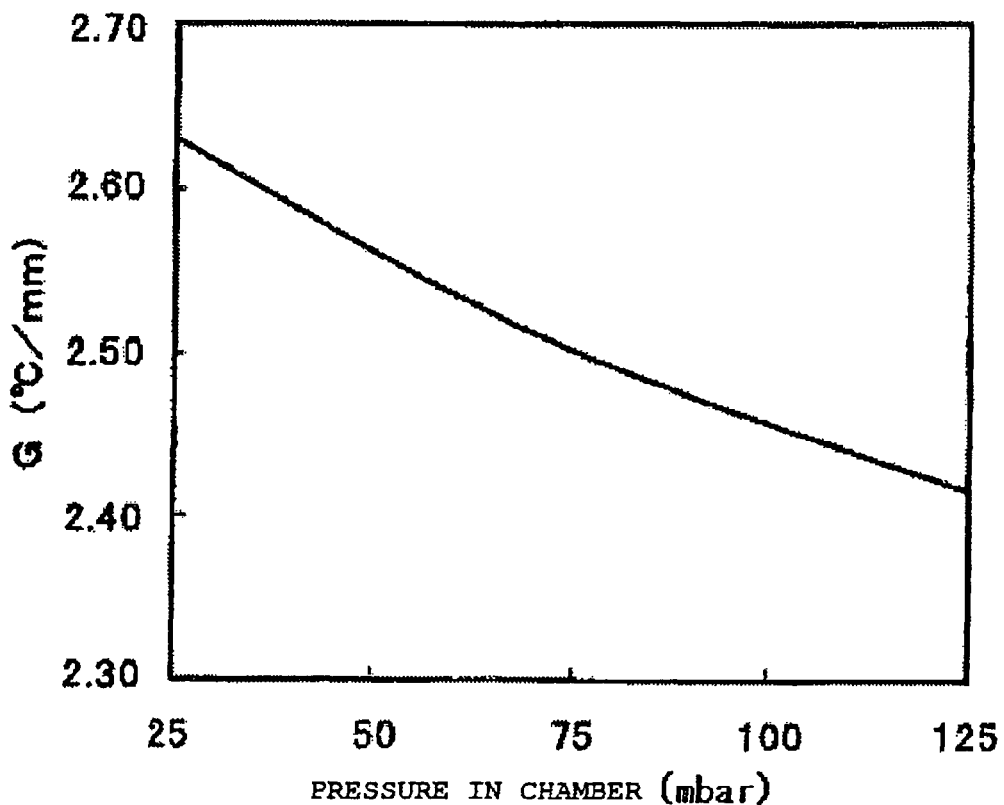
FIG. 9 is a graph showing an example of the relation between the pressure in the chamber and the crystal temperature gradient G.
Figure 10:
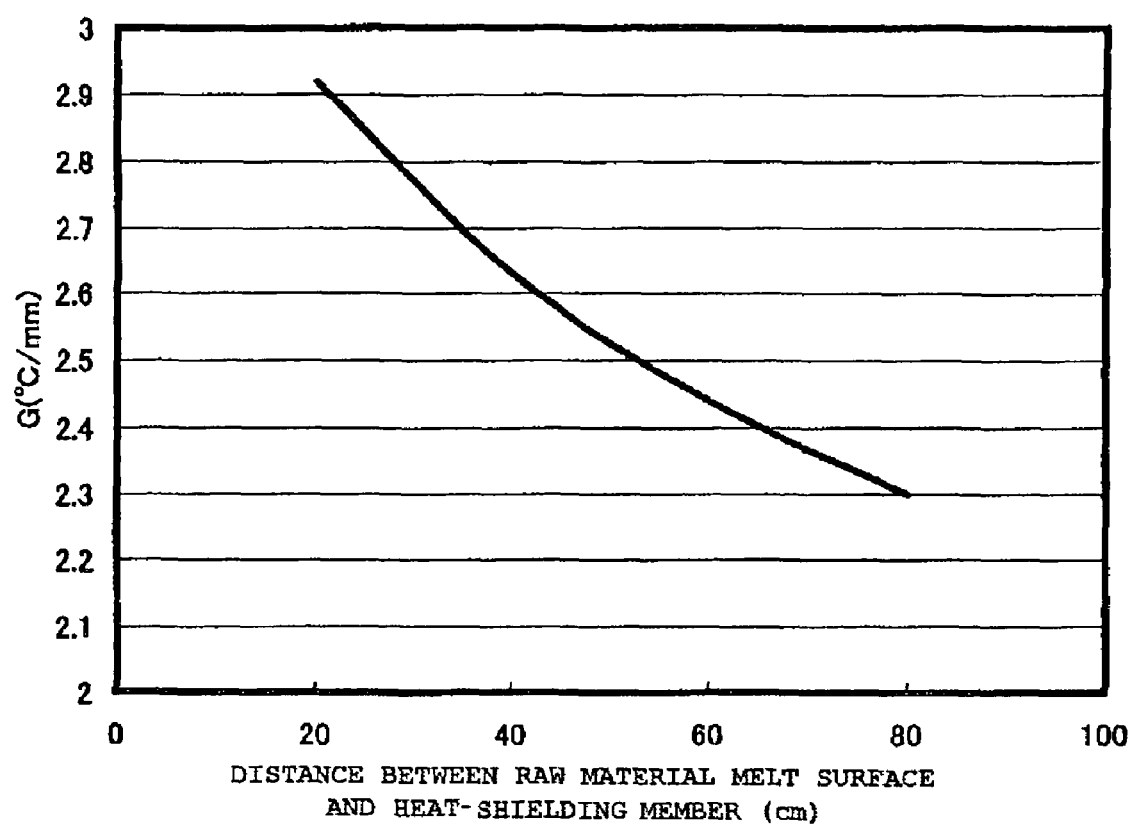
FIG. 10 is a graph showing an example of the relation between the distance between the melt surface of the raw material melt and the heat-shielding member disposed oppositely to the raw material melt surface and the crystal temperature gradient G.

Here, the respective conditions can be modified based on the preliminarily obtained relation thereof to V/G according to the elapsed time because the relation of the respective conditions to V/G can be calculated or measured in each of apparatuses. As one example, in FIGS. 8~10, the graphs showing the relations of the flow amount of the inert gas introduced in the chamber, the pressure in the chamber, and the distance between a melt surface of the raw material melt and a heat-shielding member disposed oppositely to the raw material melt surface, to the crystal temperature gradient G, are shown.

As described above, by modifying these conditions according to the elapsed time from the beginning of operation, the crystal temperature gradient G is controlled and therethrough, V/G is controlled to be a predetermined value and a single crystal having a desired defect region is grown and thereby, the precision of the quality can be improved. Furthermore, the pulling rate V is set to be large as much as possible and on the other hand, the crystal temperature gradient G is controlled by modifying at least one of the above-described conditions according to the elapsed time and thereby, V/G is controlled to be a predetermined value and thereby, it becomes possible that silicon single crystals of constant quality having a desired defect region are produced at a lower cost in larger quantity and more stably.

The single crystals grown in such pulling conditions as described above have a uniform defect size, and a wafer sliced from the single crystals is subjected to a heat treatment at 1100° C.~1400° C. for 5 min~600 min under a non-oxidizing atmosphere that is hydrogen, argon, or a mixed gas of those considering the annihilation effect of Grown-in defects required according to the state of the wafer. In addition, the upper limit values of the heat treatment time and the heat treatment temperature are reference values set considering the problems of metal contamination to the wafer product by the heat treatment and durability of the heat treatment furnace and the cost caused by the treatment time lengthening and such, and the lower limit values of the heat treatment time and the heat treatment temperature are reference values considering the annihilation effect of Grown-in defects.

In this case, in the case that the density of the surface-near defects of an annealed wafer is out of the desired density, any one or more pulling condition(s) of, the flow amount of the inert gas introduced in the chamber, the pressure in the chamber, and the distance between a melt surface of the raw material melt and a heat-shielding member disposed oppositely to the raw material melt surface is/are modified considering the density level of the surface-near defects and the elapsed time from beginning of operation, and thereby, the conditions are changed to be the most appropriate operation conditions according to the elapsed time.

Thereby, there can be obtained silicon wafers whose variation $\sigma$ of densities of surface-near defects in a surface vicinity is 100% or less of an average of the densities. As a result, it becomes possible to accurately control the variation of the densities of surface-near defects of the products to be in a certain standard, independently from elapse of the production time, and yield and productivity of the wafer products can be improved. As described above, because products of uniform qualities can be produced in large quantity in one batch by a multi-pulling method, the present invention is particularly effective in a silicon single crystal for nitrogen doped annealed wafers in which a simple modification of the pulling condition(s) in a simple uniform way is not sufficient because a plurality of factors are involved therein.

EXAMPLE 1

A crucible having a diameter of 55 cm was provided in an apparatus for producing a single crystal shown in FIG. 1, and in order to grow silicon single crystals having a diameter of 20 cm by using CZ method, first 120 kg of silicon polycrystalline raw material was charged in the crucible and nitrogen was doped so that the nitrogen concentration of the silicon single crystals to be grown became $3 \times 10^{13}$ atoms/cm$^3$. Then, the silicon polycrystalline raw material was melted by a heater heating, and a silicon singe crystal having a straight body of 100 cm and a diameter of 20 cm was grown. Next, the raw material polycrystal having the same weight as the first pulled single crystal was additionally charged in the crucible and by multi-pulling method, the pulling the crystals of the same variety was repeated.

Figure 2:
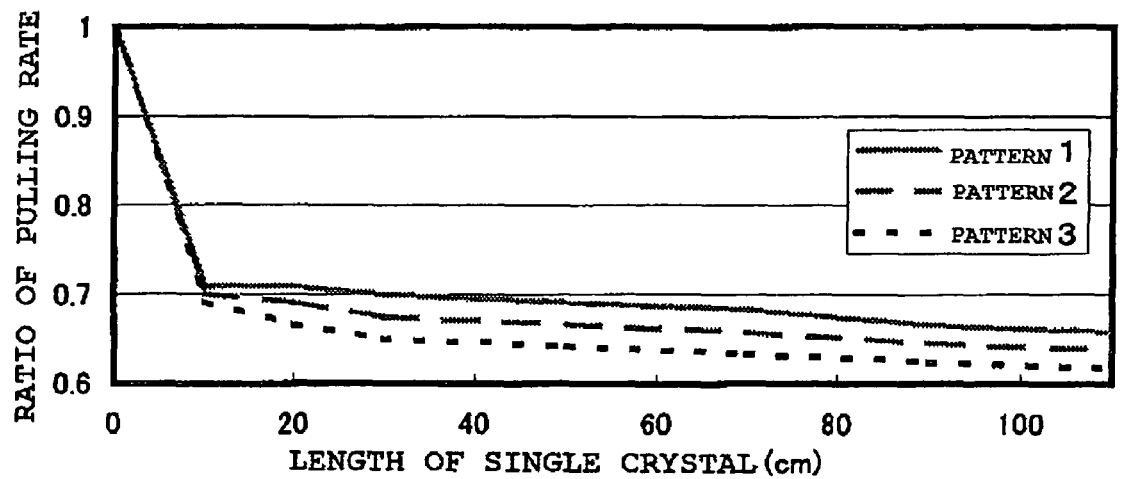
FIG. 2 is a pattern of the pulling rate V for single crystal used in Example 1.

In this time, as shown in FIG. 2, three pulling conditions of single crystal according to the time from the initiation of the heater heating were prepared. When the time from the initiation of the heater heating was 35 hours or less (the first ingot), the pulling rate of the pattern 1 was used, and when 35 hours to 70 hours (the second ingot), the pulling rate of the pattern 2 was used, and when 70 hours or more (the third ingot), the pulling rate of the pattern 3 was used and the silicon single crystals were grown. Wafers were sliced from these silicon single crystals and produced and subjected to the heat treatment in an argon atmosphere at 1200° C. for 1 hour and an average density of surface-near defects having sizes of 20 nm or more in a surface vicinity (from the surface to depth approximately 5 µm) over the wafer entire plane by an apparatus for measuring defect density near the surface (M0601, manufactured by MITUI KINZOKU Co., Ltd.) were measured.

Figure 3:
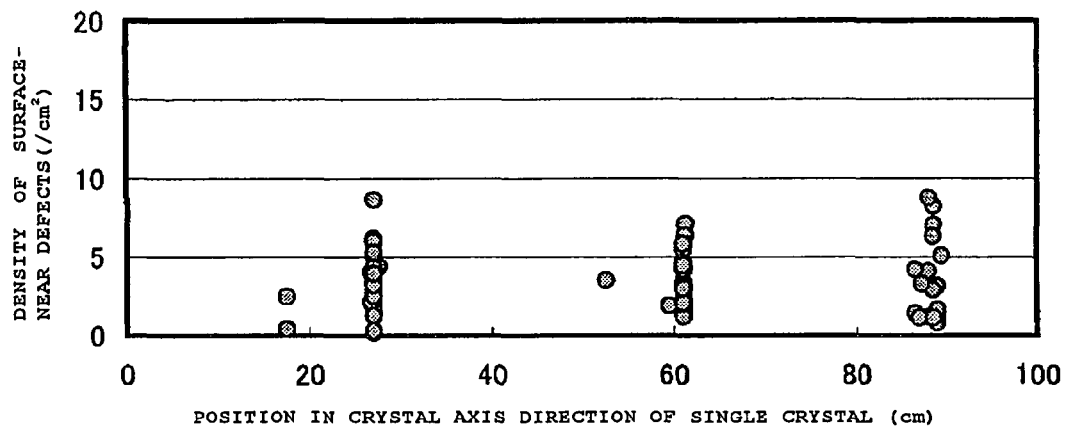
FIGS. 3(*a* to *c*) are charts showing the distribution along the crystal axis direction of the densities of the surface-near defects in the vicinity of the surface of the wafer obtained in Example 1.
Figure 3:
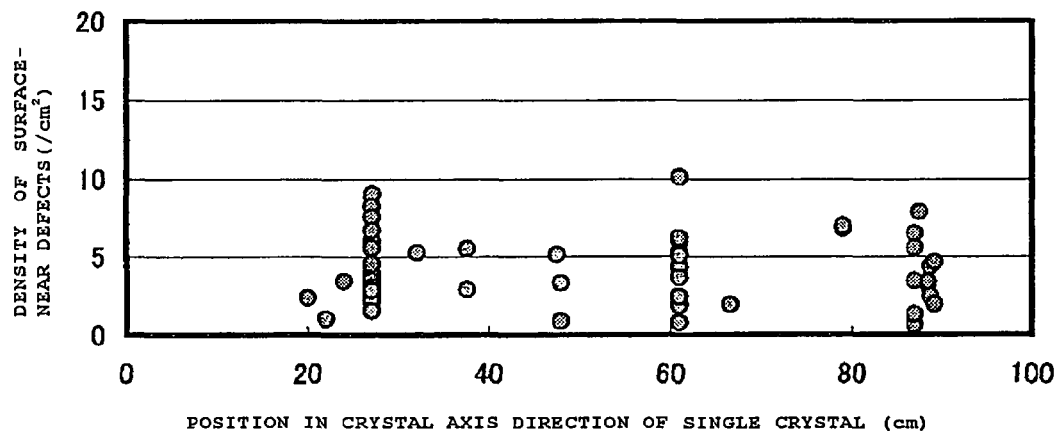
Figure 3:
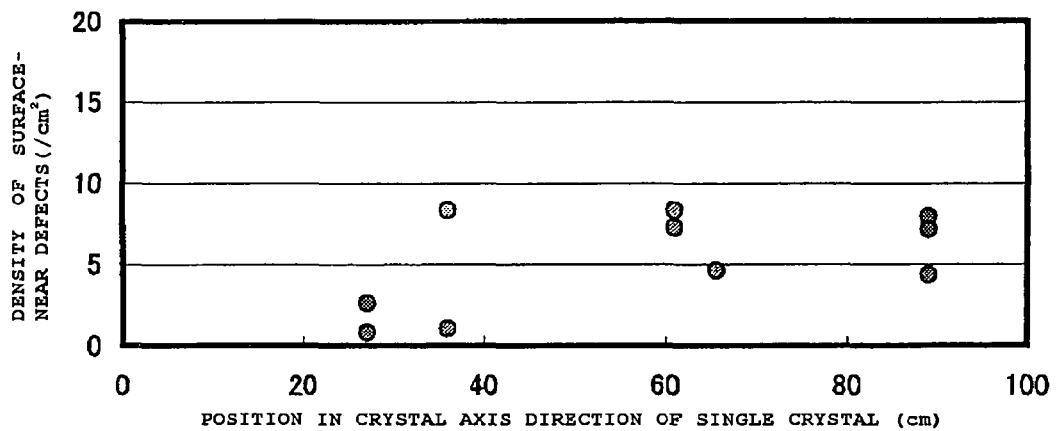
Figure 4:
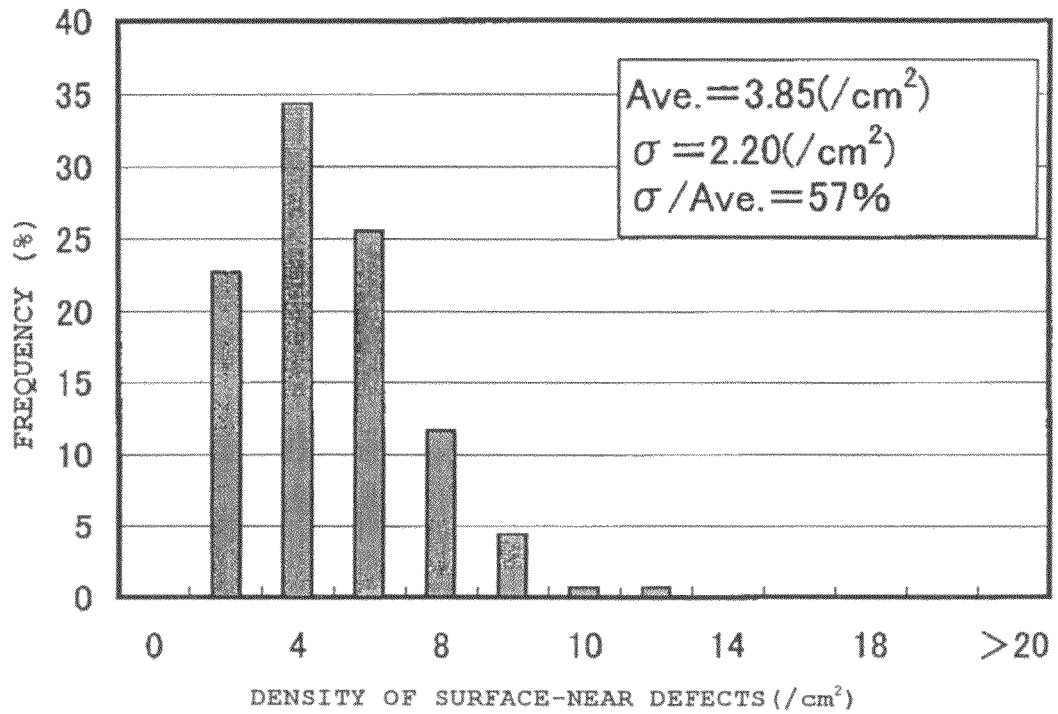
FIG. 4 is a histogram showing the density distribution of the surface-near defects in the vicinity of the surface of the wafer obtained in Example 1.

As a result, as shown in FIG. 3, in every case of the pattern 1 (first ingot), the pattern 2 (second ingot), and the pattern 3 (third ingot), densities of surface-near defects that are uniform in the longitudinal direction of the single crystal were obtained and histogram of these was shown in FIG. 4. And, the average of the densities of surface-near defects was 3.85/cm$^2$, standard deviation $\sigma$ of the variation was 57% of the average of the densities. As described above, by the present invention, independently from the elapsed time from the beginning of operation of pulling silicon single crystals, it becomes possible to reduce the variation of densities of surface-near defects in the surface vicinity of the wafer products obtained from the pulled silicon single crystals and to accurately control the variation to be in the standard.

EXAMPLE 2

Figure 5:
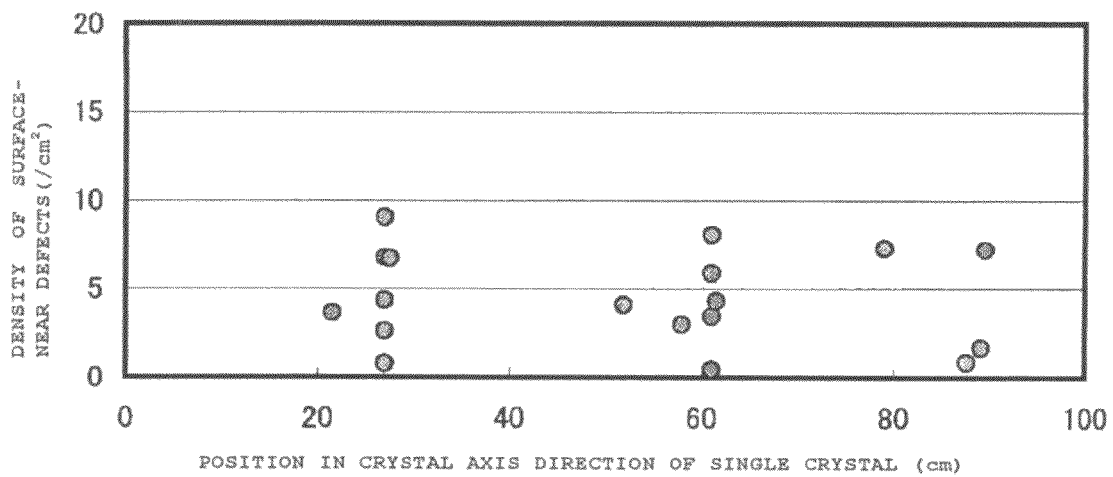
FIG. 5 is a chart showing the distribution along the crystal axis direction of the densities of the surface-near defects in the vicinity of the surface of the wafer obtained in Example 2.

Next, a pattern 2' that the flow amounts of argon gas of inert gas were changed according to the elapse of the time was prepared. In the silicon single crystal growth, the argon gas was introduced from a gas inlet duct 10 as the purge gas and passed between the single crystal 3 in pulling and the gas flow-guide cylinder 11 and then passed between the heat-insulating member 12 and the melt surface of the raw material melt 4 and discharged from the gas outlet duct 9. And, in 35 hours to 70 hours from initiation of the heater heating (the second ingot), the pattern 2' (the gas flow amount was set to be 15% more than that of the first ingot) was used. And as the pulling rate, the pattern 1 that was the same as the first ingot was used and the other conditions were set to the same as Example 1, and the evaluation was performed. As a result, as shown in FIG. 5, a uniform distribution of the densities of surface-near defects in the surface vicinity in the longitudinal direction of the single crystal was obtained, and the average of the densities of the surface-near defects was $2.65/cm^2$, and the standard deviation σ of the variation was 60% of the average of the densities. The same effect as Example 1 of FIG. 3(b) could be obtained.

COMPARATIVE EXAMPLE 1

Figure 6:
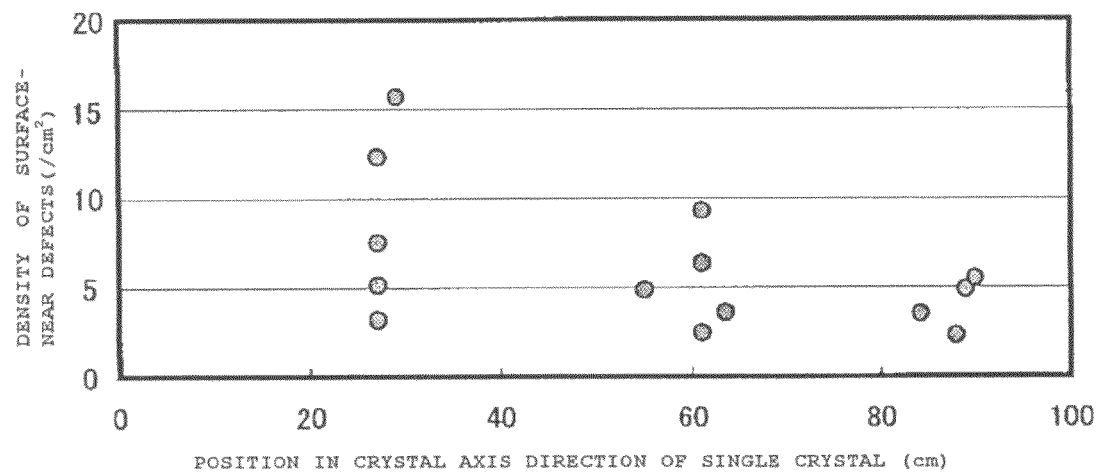
FIG. 6 is a chart showing the distribution along the crystal axis direction of the densities of the surface-near defects in the vicinity of the surface of the wafer obtained in Comparative example 1.
Figure 7:
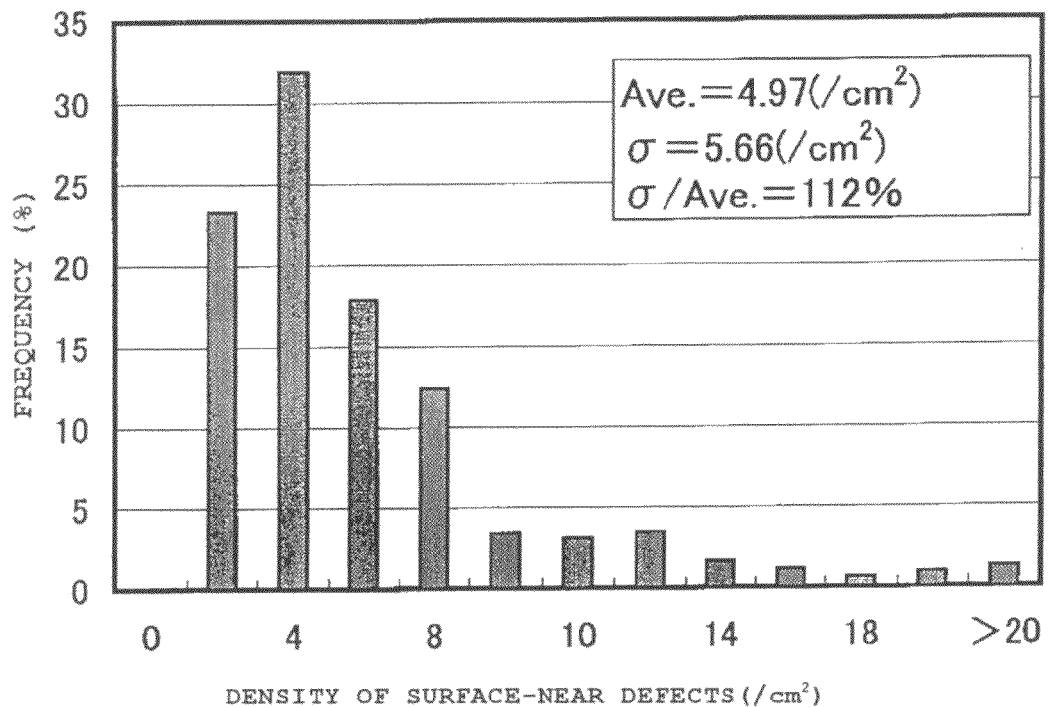
FIG. 7 is a histogram showing the density distribution of the surface-near defects in the vicinity of the surface of the wafer obtained in Comparative example 1.

By contrast of Example 1, when the time from the initiation of the heater heating is 35 hours to 70 hours (the second ingot), the same pattern 1 as the first ingot was used and the single crystal was grown and the other conditions were set to the same as Example 1 and the evaluation was performed. As a result, as shown in FIG. 6, it was found that the uniformity was impaired, compared to the pattern 1: 35 hours or less of the Example 1 shown in FIG. 3(a) or the pattern 2: 35 hours to 70 hours of Example 1 shown in FIG. 3(b). Furthermore, despite the elapsed time from the initiation of the heater heating, the silicon single crystals were grown by using the same pattern 1 in the all of the silicon single crystals, and the other conditions were set to be the same as Example 1. The histogram in this case was shown in FIG. 7. As a result, the average of the densities of the surface-near defects was $4.97/cm^2$, and the standard deviation a of the variation was 112% of the average of the densities.

As described above, when the pulling conditions are not modified for controlling V/G of the pulled single crystal to be a predetermined value according to the elapsed time from the beginning of operation of the production of the silicon single crystals, the variation of the densities of surface-near defects in the surface vicinities of the wafer products obtained from the pulled silicon single crystals becomes large and is difficult to be in the standard.

The present invention is not limited to the above-described embodiments. The above-described embodiments are mere examples, and those having the substantially same constitution as that described in the appended claims and providing the similar action and advantages are included in the scope of the present invention.

The invention claimed is:

1. A method for producing a single crystal that is a multi-pulling method for pulling a plurality of single crystals from a raw material melt in a same crucible in a chamber by a Czochralski method, comprising steps of:
pulling a single crystal from a raw material melt; then
additionally charging polycrystalline raw material in a residual raw material melt without turning off power of a heater, and melting the polycrystalline raw material; then
pulling a next single crystal; and
repeating the steps and thereby pulling the plurality of single crystals;
wherein in a case of setting a ratio of a pulling rate V and crystal temperature gradient G near a solid-liquid interface along a pulling axis direction when a straight body of the single crystal is grown to be V/G, in order to control the V/G of each of the single crystals to be pulled to a predetermined value, any one or more of pulling conditions of at least, the pulling rate V, flow amount of an inert gas introduced into the chamber, pressure in the chamber, and distance between a melt surface of the raw material melt and a heat-shielding member disposed oppositely to the raw material melt surface in the chamber, is preliminarily modified according to an elapsed time from beginning of operation, before initiating pulling each next single crystal but after pulling of an immediately preceding crystal; and thereby
the single crystal having a desired defect region is grown.

2. The method for producing a single crystal according to claim 1, wherein in a case of pulling at least two or more single crystals having a same variety out of the plurality of single crystals to be pulled, in order that the V/G is a same predetermined value, the pulling condition(s) of each of the single crystals is/are preliminarily modified according to what time of pulling the single crystal is, before initiating pulling the single crystal.

3. The method for producing a single crystal according to claim 1, wherein the modification of the pulling condition(s) is performed by
preliminarily preparing a plurality of patterns of the respective pulling conditions under the elapsed time and
selecting the most appropriate pattern of the pulling condition for the single crystal to be pulled according to the elapsed time.

4. The method for producing a single crystal according to claim 2, wherein the modification of the pulling condition(s) is performed by
preliminarily preparing a plurality of patterns of the respective pulling conditions under the elapsed time and
selecting the most appropriate pattern of the pulling condition for the single crystal to be pulled according to the elapsed time.

5. The method for producing a single crystal according to claim 1, wherein a silicon single crystal that is the single crystal doped with nitrogen is pulled.

6. The method for producing a single crystal according to claim 2, wherein a silicon single crystal that is the single crystal doped with nitrogen is pulled.

7. The method for producing a single crystal according to claim 3, wherein a silicon single crystal that is the single crystal doped with nitrogen is pulled.

8. The method for producing a single crystal according to claim 4, wherein a silicon single crystal that is the single crystal doped with nitrogen is pulled.

9. A method for producing an annealed wafer, comprising steps of:
producing a silicon single crystal according to claim 1;
slicing a silicon wafer from the silicon single crystal;
subjecting the silicon wafer to a heat treatment at 1100° C. ~1400° C. for 5 min ~600 min under a non-oxidizing atmosphere of hydrogen, argon, or a mixed gas thereof; and thereby producing the annealed wafer.

10. A method for producing an annealed wafer, comprising steps of:
produce a silicon single crystal according to claim 2;
slicing a silicon wafer from the silicon single crystal;
subjecting the silicon wafer to a heat treatment at 1100° C.~1400° C. for 5 min ~600 min under a non-oxidizing atmosphere of hydrogen, argon, or a mixed gas thereof; and thereby producing the annealed wafer.

11. A method for producing an annealed wafer, comprising steps of:
producing a silicon single crystal according to claim 3;
slicing a silicon wafer from the silicon single crystal;
subjecting the silicon wafer to a heat treatment at 1100° C.~1400° C. for 5 min ~600 min under a non-oxidizing atmosphere of hydrogen, argon, or a mixed gas thereof; and thereby producing the annealed wafer.

12. A method for producing an annealed wafer, comprising steps of:
producing a silicon single crystal according to claim 4;
slicing a silicon wafer from the silicon single crystal;
subjecting the silicon wafer to a heat treatment at 1100° C.~1400° C. for 5 min ~600 min under a non-oxidizing atmosphere of hydrogen, argon, or a mixed gas thereof; and thereby producing the annealed wafer.

13. A method for producing an annealed wafer, comprising steps of:
producing a silicon single crystal according to claim 5;
slicing a silicon wafer from the silicon single crystal;
subjecting the silicon wafer to a heat treatment at 1100° C.~1400° C. for 5 min ~600 min under a non-oxidizing atmosphere of hydrogen, argon, or a mixed gas thereof; and thereby producing the annealed wafer.

14. A method for producing an annealed wafer, comprising steps of:
producing a silicon single crystal according to claim 6;
slicing a silicon wafer from the silicon single crystal;
subjecting the silicon wafer to a heat treatment at 1100° C.~1400° C. for 5 min ~600 min under a non-oxidizing atmosphere of hydrogen, argon, or a mixed gas thereof; and thereby producing the annealed wafer.

15. A method for producing an annealed wafer, comprising steps of:
producing a silicon single crystal according to claim 7;
slicing a silicon wafer from the silicon single crystal;
subjecting the silicon wafer to a heat treatment at 1100° C.~1400° C. for 5 min ~600 min under a non-oxidizing atmosphere of hydrogen, argon, or a mixed gas thereof; and thereby producing the annealed wafer.

16. A method for producing an annealed wafer, comprising steps of:
producing a silicon single crystal according to claim 8;
slicing a silicon wafer from the silicon single crystal;
subjecting the silicon wafer to a heat treatment at 1100° C.~1400° C. for 5 min ~600 min under a non-oxidizing atmosphere of hydrogen, argon, or a mixed gas thereof; and thereby producing the annealed wafer.

17. The method for producing an annealed wafer according to claim 9, wherein
an average density of surface-near defects having sizes of 20 nm or more in a surface vicinity from each of surfaces of the annealed wafers to a depth of 5 μm is 20/cm$^2$ or less, and
variations of densities of surface-near defects having sizes of 20 nm or more in a surface vicinity from each of surfaces of the annealed wafers to a depth of 5 μm along its crystal axis direction is 100% or less of an average of the densities.

18. The method for producing an annealed wafer according to claim 16, wherein
an average density of surface-near defects having sizes of 20 nm or more in a surface vicinity from each of surfaces of the annealed wafers to a depth of 5 μm is 20/cm$^2$ or less, and
variations of densities of surface-near defects having sizes of 20 nm or more in a surface vicinity from each of surfaces of the annealed wafers to a depth of 5 μm along its crystal axis direction is 100% or less of an average of the densities.

\* \* \* \* \*